United States Patent [19]

Cupo et al.

[11] Patent Number: 5,353,312
[45] Date of Patent: Oct. 4, 1994

[54] EQUALIZER-BASED TIMING RECOVERY

[75] Inventors: Robert L. Cupo, Eatontown; Cecil W. Farrow, Highlands, both of N.J.

[73] Assignee: AT&T Bell Laboratories, Murray Hill, N.J.

[21] Appl. No.: 815,010

[22] Filed: Dec. 27, 1991

[51] Int. Cl.[5] .............................................. H03H 7/30
[52] U.S. Cl. ..................................... 375/106; 375/14; 333/18
[58] Field of Search .................... 375/11, 14, 106, 110, 375/99, 101, 103, 15, 26; 333/18, 28 R; 364/724.2

[56] References Cited

U.S. PATENT DOCUMENTS

| | | | |
|---|---|---|---|
| 4,004,226 | 1/1977 | Qureshi et al. | 325/42 |
| 4,334,313 | 6/1982 | Gitlin | 375/106 |
| 4,621,366 | 11/1986 | Cain et al. | 375/106 |
| 4,692,931 | 9/1987 | Ohsawa | 375/106 |
| 4,800,574 | 1/1989 | Tanaka et al. | 375/26 |
| 4,805,191 | 2/1989 | Burch et al. | 375/106 |
| 4,815,103 | 3/1989 | Cupo | 375/14 |
| 4,975,927 | 12/1990 | Yoshida | 375/106 |
| 5,048,060 | 9/1991 | Arai et al. | 375/106 |
| 5,097,488 | 3/1992 | Kokubo et al. | 375/106 |

OTHER PUBLICATIONS

*The Bell System Technical Journal,* vol. 54, p. 564 et seq., Mar. 1975.

*Primary Examiner*—Stephen Chin
*Assistant Examiner*—Don Vo
*Attorney, Agent, or Firm*—David R. Padnes

[57] ABSTRACT

Timing recovery circuitry for recovering digital data generates a timing signal which is a function of the delay provided by an equalizer to one or more predetermined frequency components of its input signal. Advantageously, this approach is applicable to systems which utilize one or more baseband or passband equalizers. The disclosed embodiments of the present invention pertain to a dual-duplex system. In such a system, the digital data to be transmitted is divided into two different digital signals and each signal is coupled through an associated transmission channel. At the receiver, the received version of each transmitted signal is processed by an associated equalizer and the outputs therefrom are combined to recover the digital data. In the disclosed embodiments of the present invention, the necessary timing signal for such recovery is a function of the delay introduced by each equalizer to at least one predetermined frequency component of that equalizer's input signal.

24 Claims, 3 Drawing Sheets

EQUALIZER-BASED TIMING RECOVERY

TECHNICAL FIELD

The present invention relates generally to data communications and, more particularly, to a timing recovery technique used in data receivers which have automatic equalizers or adaptive equalizers.

BACKGROUND OF THE INVENTION

Accurate reception of high-speed data signals transmitted over a band-limited channel with unknown transmission characteristics requires the use of an adaptive or automatic equalizer. Such an equalizer is generally resident in the receiver portion of a data set, or modem, and is typically in the form of a transversal filter. Samples of the received data signal, hereinafter referred to as line samples, are formed at some predetermined sampling rate. The line samples are applied to the transversal filter, in which each is multiplied by a respective one of a set of coefficients. The resulting products are added together and, if necessary, demodulated to generate a baseband signal, referred to herein as an equalizer output. The value of each equalizer output is used as the basis for forming a decision as to the value of a respective transmitted data symbol.

In automatic and adaptive equalizers, the coefficients are updated or adapted using an error signal in such a way as to minimize a measure of the channel-induced distortion—assumed to be primarily intersymbol interference—in the equalizer outputs.

An important equalizer operating parameter, in addition to the rate at which the line samples are formed, is their time occurrence with respect to the received signal. On the one hand, the coefficient values subsisting in the equalizer at any given time are determined with the received signal having been sampled at a particular set of time points on the received signal. On the other hand, the transmitter and receiver clocks invariably differ from one another, if only by a small amount. Over time, this frequency difference, if not compensated for, would cause the received signal to be sampled further and further away from the appropriate time points, this phenomenon being referred to as "timing drift".

To deal with this problem, the receiver is typically provided with a timing recovery circuit. The timing recovery circuit determines whether the line samples are being formed later or earlier than they should be and, in response, adjusts the phase of the line sample forming circuit such that the line samples are formed at the appropriate time.

A variety of timing recovery circuits are known. See, for example, the so-called envelope-derived timing recovery, disclosed in *The Bell System Technical Journal*, Vol. 54, Page 564 et seq., March 1975, or that disclosed in U.S. Pat. No. 4,004,226 to S. U. H. Qureshi et al., or that disclosed in U.S. Pat. No. 4,334,313, issued Jun. 8, 1982 to R. D. Gitlin et al.

Although the above timing recovery schemes work satisfactorily, they are not amenable to quantitative analysis, making it difficult to "fine-tune" the timing recovery process. Such fine-tuning has become increasingly necessary with higher and higher data speeds.

More recently, in U.S. Pat. No. 4,815,103 issued to the inventors herein, a timing recovery technique is disclosed which utilizes the equalizer coefficients as the basis of timing recovery, using a computed quantity parameter referred to as the "center of gravity" of the equalizer coefficients. While this technique has provided fine-tuning capability, it is not amenable for use with a passband equalizer or multiple baseband equalizers. It would, therefore, be desirable if a timing recovery scheme possessing the advantages of the center of gravity approach could be devised which would be operable with one or more passband or baseband equalizers.

SUMMARY OF THE INVENTION

Broadly speaking, the present invention overcomes the limitations of prior art timing recovery techniques by generating a timing signal which is a function of the delay provided by an equalizer to one or more predetermined frequency components of its input signal. This approach permits fine-tuning of passband and baseband equalizers and, advantageously, this approach is also applicable to systems which utilize more than one baseband or passband equalizer.

The disclosed embodiments of the present invention pertain to a dual-duplex system. In such a system, the digital data to be transmitted is divided into two different digital signals and each signal is coupled through an associated transmission channel. At the receiver, the received version of each transmitted signal is processed by an associated equalizer and the outputs therefrom are combined to recover the digital data. In the disclosed embodiments of the present invention, the necessary timing signal for such recovery is a function of the delay introduced by each equalizer to at least one predetermined frequency component of that equalizer's input signal.

DETAILED DESCRIPTION

Figure 1:
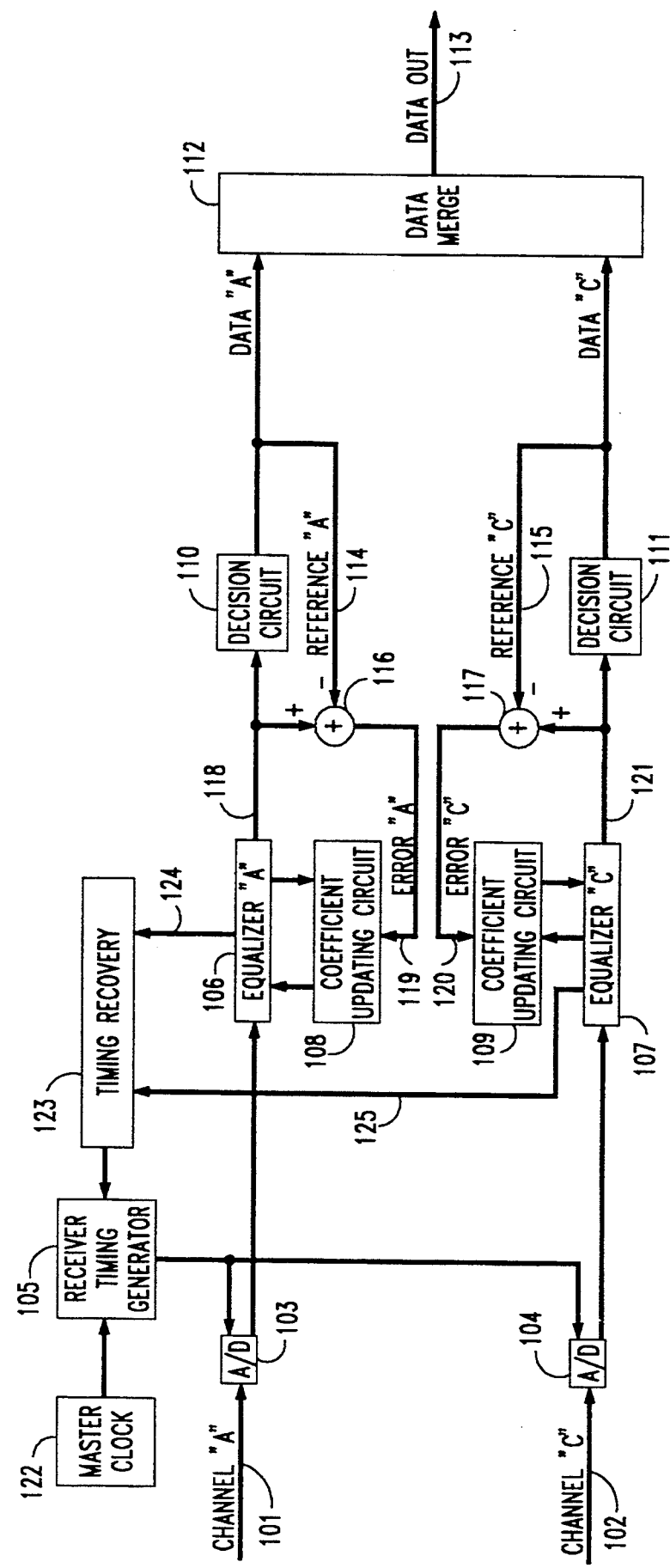
FIG. 1 is an illustrative embodiment of a data signal receiver which includes timing recovery circuitry embodying the principles of the present invention.

FIG. 1 shows an embodiment of a receiver 100 adapted for use in an illustrative dual-duplex system. At the transmitter (not shown) of such a system, digital data in the form of bits at some predetermined rate is divided to provide two bit streams. Each bit stream is then modulated using conventional quadrature amplitude modulation (QAM) wherein, for example, 4 bits are encoded into a symbol having an in-phase and quadrature component. Each symbol component can take on one of four permissible signal values of $+1$, $-1$, $+3$ and $-3$. The two symbol components in each channel then respectively modulate the amplitude of an associated one of two quadrature related carrier signals having a predetermined frequency. These modulated carrier signals, in combination, comprise the transmitted QAM signal. The modulated carrier signals are then transmitted through two channels, designated as channel "A" and "C". Each of these channels is typically bidirectional but for purposes of simplicity the description which follows will only discuss the signal processing in one transmission direction. Each of the transmission channels has an associated signal propagation delay which is generally different and which varies with time. It will, of course, be understood that the present invention is also applicable to transmission systems using other modulation schemes as well as to baseband systems and can be used in systems using virtually any baud or bit rates.

The QAM signal transmitted through each channel represents a succession of data symbols transmitted at a rate of 1/T symbols per second. This signal is received on leads 101 and 102. As shown in FIG. 1, the signals on leads 101 and 102 are respectively coupled through analog-to-digital (A/D) converters 103 and 104 to form the line samples. Each of these A/D converters is strobed by a common sampling clock signal provided by receiving timing generator 105. Generator 105 provides these sampling clock signals in response to the master clock signals from master clock source 122 and to signals from timing recovery circuit 123. These sampling clock signals are also coupled to leads (not shown) to control the sequencing of various signal processing functions within receiver 100.

The rate of the sampling clock signals provided to A/D converters 103 and 104 causes each of these converters to generate line samples at n/T samples per second, where n is a predetermined integer greater than one. Equalizers 106 and 107 in well-known fashion, each utilize an associated plurality of coefficients to compensate for the distortion in channels A and C, respectively. Advantageously, since the distortion in the channels vary with time, equalizers 106 and 107 are of the automatic or adaptive variety and their respective coefficients have values which vary with time. Such updated coefficients are provided to equalizers 106 and 107 by coefficients updating circuits 108 and 109, respectively.

Since each equalizer receives and processes more than one input for each symbol interval, each equalizer is referred to as a fractionally-spaced equalizer and more specifically as a T/n type of fractionally-spaced equalizer since each receives and processes n samples per symbol interval. The output of equalizer 106 and 107 is generated once per symbol interval and is respectively coupled through decision circuits 110 and 111. Each decision circuit quantizes its coupled equalizer output to the closest one of a plurality of permissible transmitted signal levels. The output from decision circuits 110 and 111 respectively represent the digital data which was transmitted through channels A and C.

Data merge circuit 112 combines the outputs of the decision circuits so as to reconstruct on lead 113 the digital data prior to its division and transmission through the two transmission channels.

The outputs from decision circuits 110 and 111 are also respectively coupled through leads 114 and 115 to adders 116 and 117 to serve as reference signals "A" and "C". Adder 116 subtracts the decision circuit output on lead 114 from the equalizer output on lead 118 to form the error signal for channel "A" on lead 119. This error signal "A" is used in well-known fashion by coefficient updating circuit 108 to update the coefficients for equalizer 106. In similar fashion, adder 117 forms the error signal "C" on lead 120 by subtracting the output of decision circuit 111 on lead 115 from the output of equalizer 107 on lead 121. Error signal "C" is used by coefficient updating circuit 109 to provide the updated coefficients for equalizer 107.

The clock signal for A/D converters 103 and 104 is provided by receiver timing generator 105 in response to a master clock signal furnished by master clock 122 and to timing adjustment signals provided by timing recovery circuit 123. The master clock signal has a predetermined frequency. To compensate for timing offset and drift, the frequency and/or phase of this master clock signal is altered by receiver timing generator 105 using timing adjustment signals provided by the timing recovery circuit 123. Pursuant to the present invention, these timing adjustment signals are a function of the delay introduced by each equalizer to one or more predetermined nonzero frequency components of its input signal. This delay is a function of the equalizer coefficients which are coupled to via leads 124 and 125 to timing recovery circuit 123.

For the mathematical discussion which follows, these equalizers and their coefficients which will be respectively represented by the subscripts A and C to denote the relationships of these equalizers to channels A and C. Each of the coefficients of equalizers A and C is a complex number in the illustrative dual-duplex receiver 100. We can represent the $k^{th}$ coefficient of equalizer A, where "k" is an integer which spans a range equal to the number of coefficients in equalizer A, by the expression $a_k + jb_k$ where "a" and "b" respectively are the real and imaginary components of the $k^{th}$ coefficient. Similarly, the $k^{th}$ coefficient of equalizer C can be represented by the expression $c_k + jd_k$ where c and d respectively are the real and imaginary components thereof. It can be shown that the delay of equalizer A for a signal having a frequency $\omega$ can be represented by $D_A(\omega)$ where $$D_A(\omega) = \frac{Q_A + R_A}{S_A} \quad (1)$$

and where $$Q_A = \frac{T}{n}\left[\sum_k b_k\cos(k\omega T) - a_k\sin(k\omega T)\right]\left[\sum_k kb_k\cos(k\omega T) - ka_k\sin(k\omega T)\right],$$

$$R_A = \frac{T}{n}\left[\sum_k a_k\cos(k\omega T) + b_k\sin(k\omega T)\right]\left[\sum_k kb_k\sin(k\omega T) + ka_k\cos(k\omega T)\right],$$

and $$S_A = \left[\sum_k b_k\cos(k\omega T) - a_k\sin(k\omega T)\right]^2 + \left[\sum_k a_k\cos(k\omega T) + b_k\sin(k\omega T)\right]^2$$

and

T = the sampling interval.

Similarly, the delay of equalizer C for a signal having a frequency $\omega$, can be represented by $D_C(\omega)$ where $$D_C(\omega) = \frac{Q_C + R_C}{S_C} \quad (2)$$

and $Q_C$, $R_C$ and $S_C$ are respectively calculated in the same manner as $Q_A$, $R_A$ and $S_A$ by substituting $c_k$ for $a_k$ and $d_k$ for $b_k$.

In generating a timing signal which is a function of the equalizer delay for a predetermined nonzero frequency component of the equalizer input signal, it is advantageous to select such a component which is in the frequency "band of interest". The frequency band of interest is that frequency interval over which substantially all of the transmitted signal energy is concentrated. For a baseband transceiver, this interval extends from dc to some upward baseband edge and, for a passband transceiver, the interval extends from a lower to an upper passband edge. In many communication applications, each edge of the frequency band of interest is referred to as a "3dB point". In addition, Eq. 1 can be simplified by judicious selection of the nonzero frequency in the frequency band of interest. One such choice is $$\omega T = \frac{\pi}{2}$$

for which value Eq. (1) yields $$D_A(\omega) = \frac{Q_A\left(\frac{\pi}{2}\right) + R_A\left(\frac{\pi}{2}\right)}{S_A\left(\frac{\pi}{2}\right)}$$

where $$Q_A\left(\frac{\pi}{2}\right) = \frac{T}{n}\left[\sum_k b_k\cos\left(k\frac{\pi}{2}\right) - a_k\sin\left(k\frac{\pi}{2}\right)\right]\left[\sum_k kb_k\cos\left(k\frac{\pi}{2}\right) - ka_k\sin\left(k\frac{\pi}{2}\right)\right],$$

$$R_A\left(\frac{\pi}{2}\right) = \frac{T}{n}\left[\sum_k a_k\cos\left(k\frac{\pi}{2}\right) + b_k\sin\left(k\frac{\pi}{2}\right)\right]\left[\sum_k kb_k\sin\left(k\frac{\pi}{2}\right) + ka_k\cos\left(k\frac{\pi}{2}\right)\right],$$

and $$S_A\left(\frac{\pi}{2}\right) = \left[\sum_k b_k\cos\left(k\frac{\pi}{2}\right) - a_k\sin\left(k\frac{\pi}{2}\right)\right]^2 + \left[\sum_k a_k\cos\left(k\frac{\pi}{2}\right) + b_k\sin\left(k\frac{\pi}{2}\right)\right]^2$$

Eq. 2 can be simplified by noting that:

| $\omega T$ | $\sin\omega T$ | $\cos\omega T$ |
|---|---|---|
| 0 | 0 | 1 |
| $\frac{\pi}{2}$ | 1 | 0 |
| $\pi$ | 0 | $-1$ |
| $\frac{3\pi}{2}$ | $-1$ | 0 |

It should be noted that the sin and cos functions are periodic for integer values of $\omega T$ greater than $$\frac{3\pi}{2}.$$

Of course, an equivalent simplified equation for equalizer C for $$\omega T = \frac{\pi}{2}$$

can be realized by substituting $c_k$ for $a_k$ and $d_k$ for $b_k$.

Pursuant to the first embodiment of the present invention, compensation for timing drift and offset is provided by evaluating Eq. (1) for each equalizer in the receiver for a predetermined nonzero frequency component of that equalizer's input signal in the frequency band of interest. To simplify each such evaluation, a frequency such as $$\omega T = \frac{\pi}{2}$$

is preferably used.

Timing recovery circuit 123, in accordance with the first embodiment of the present invention, utilizes the foregoing equalizer delays and maintains a variable $X_m$. The subscript m for this variable and others that will be discussed denotes the value of the variable in the $m^{th}$ sampling interval. The remainder of the discussion in regard to the first embodiment of the present invention is similar to that disclosed in Applicants' prior U.S. Pat. No. 4,815,103, issued Mar. 21, 1989, which is hereby incorporated by reference. In particular, the value of the variable $X_m$ is updated, i.e., incremented or decremented, for each symbol interval as a function of (a) a parameter $\Delta X_m$, whose value is related to the present timing offset, and (b) a paramenter $V_m$, whose value is related to the present rate of change thereof, i.e., timing drift. In particular, $X_m$ is updated in accordance with the relation $$X_{m+1} = X_m + \Delta X_m + V_m \quad (4)$$

That is, the value of this variable associated with the $(m+1)^{st}$ symbol interval is given by its value associated with the $m^{th}$ symbol interval updated by the values of $\Delta X_m$ and $V_m$. Once the magnitude of $X_m$ exceeds a predetermined threshold in a positive (negative) direction, this is indicative of a situation in which the timing offset and/or timing drift has been sufficiently positive (negative) over some preceding number of symbol intervals that an advance (retarding) of receiver timing is thereupon made. The value of $X_m$ is then reset to zero and the process continues. In this embodiment, $\Delta X_m$ and $V_m$ have small fractional values and the threshold of $X_m$ is of magnitude unity.

Specifically, the parameter $\Delta X_m$ is illustratively given by $$\Delta X_m = \nu SGN(x_m), \quad (5)$$

where $\nu$ is a predetermined constant, SGN is a function whose magnitude is unity and whose sign is the sign of its argument, and $x_m$ is the present timing offset. The value of $x_m$ is determined, in accordance with the present invention, by forming the average of $D_A(\omega)$ and $D_C(\omega)$ for a predetermined nonzero frequency component of each such equalizer's input signal in the frequency band of interest. Thus, whenever the timing offset is positive (negative), an increment of fixed magnitude is added to (subtracted from) $X_m$ in each successive symbol interval.

The other parameter in Eq. (4), viz., the parameter $V_m$, takes account of timing drift, which is principally due to the inevitable (albeit possibly very small) discrepancy between the transmitter and receiver master clock frequencies. This discrepancy, if not accounted for, would manifest itself in the form of an ongoing incremental change in the magnitude of the timing offset. By adding $V_m$ (which may have either a positive or a negative value) to $X_m$ for each symbol interval, we effectively cancel the incremental change in timing offset that would otherwise occur.

Like $X_m$, the parameter $V_m$ is also arrived at through an iterative updating process, viz., $$V_m = V_{m-1} + \Delta V_m. \quad (6)$$

The parameter $\Delta V_m$ is illustratively given by $$\Delta V_m = \frac{\mu}{\alpha} v_m \quad (7)$$

where $\mu$ and $\alpha$ are predetermined constants and $v_m$ is the present rate of change, or "velocity", of the timing offset. The value of $v_m$, like the value of $x_m$, is determined, in accordance with the first embodiment of the present invention, from the coefficients of both equalizers in FIG. 1, as discussed hereinbelow.

The parameter $v_m$ will be non-zero as long as $V_m$ has not reached a steady-state value. Thus, the value of $V_m$ is subject to a continual updating until, in fact, a steady-state value is reached, that value being such as to substantially compensate for what would otherwise be a continual timing drift principally due, as mentioned above, to transmitter/receiver clock frequency differences. From that point on, the value of $v_m$, and thus of $\Delta V_m$, will be substantially zero.

In general, it is desirable to assure that timing changes are made in small increments over time. It is for this reason that the magnitude of $\Delta X_m$ is not a function of the magnitude of $x_m$ but, rather, only of its sign. Specifically, if the magnitude of $\Delta X_m$ were to be a function of the magnitude of $x_m$, $\nu$ would have to be made sufficiently small to ensure that $\Delta X_m$ would not be unduly large when $x_m$ took on its maximum value. Such a small value of $\nu$ would, however, result in an inadequately long timing adjustment when $x_m$ was small. Using $\Delta X_m = \nu \cdot SGN(x_m)$ solves this problem.

On the other hand, $v_m$ takes on a sufficiently small range of values—its maximum value being limited by the maximum allowable frequency deviation in the modem master clock—that, by judicious choice of the values of $\mu$ and $\alpha$, the magnitude of $v_m$ can be used in determining $\Delta V_m$ without engendering unduly abrupt timing changes.

In summary, then, the values of $\mu$, $\alpha$ and $\nu$ are chosen in such a way as to ensure that the timing recovery technique can, in fact, account for worst-case timing drift and correct for same in a reasonable time period without, on the other hand, making timing adjustments too abruptly. Illustratively, $\mu = 2^{-8}$, $\alpha = 2^{-8}$, and $\nu = 2^{-12}$.

Figure 2:
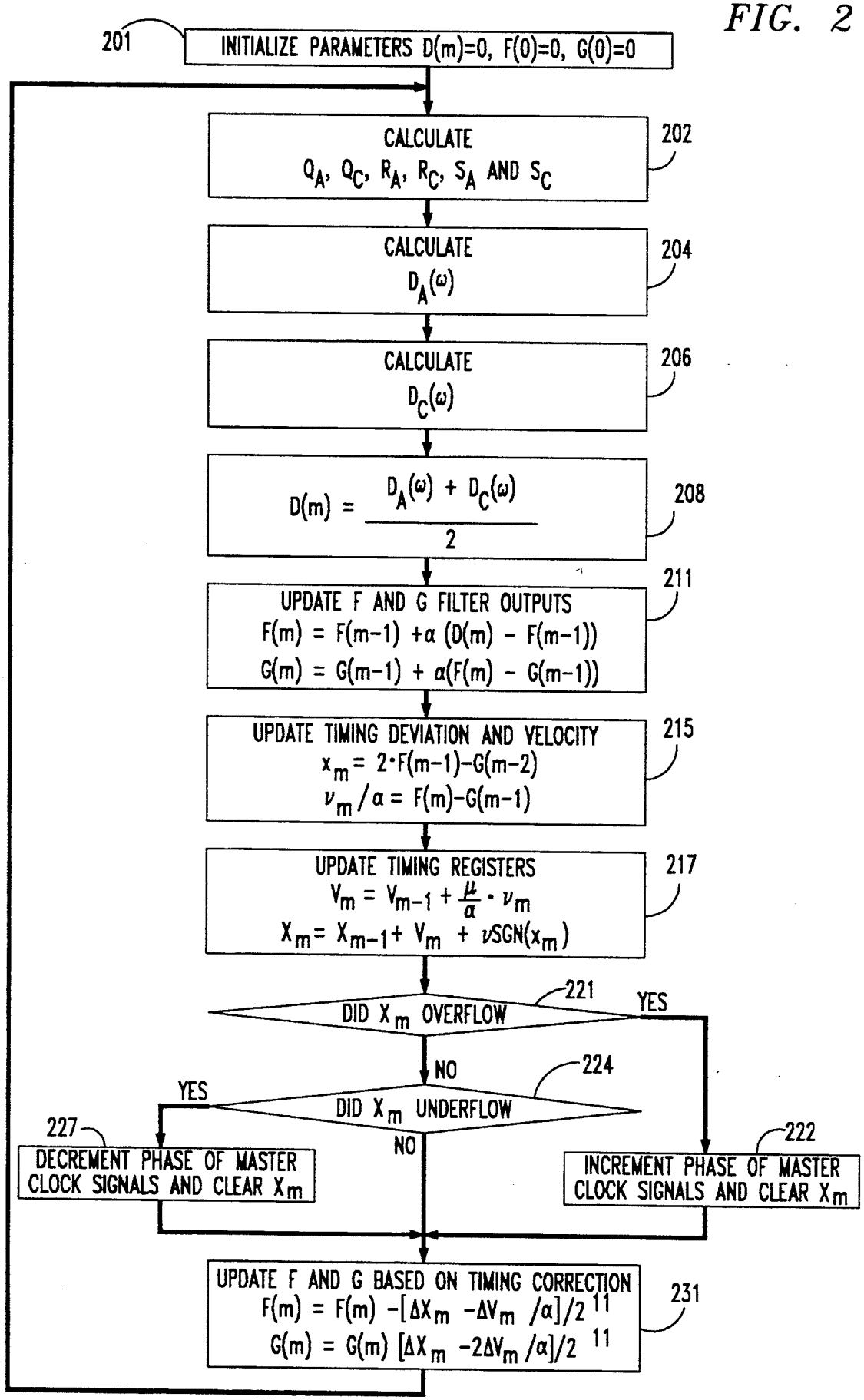
FIGS. 2 and 3 are respectively flowcharts utilized by the timing recovery circuit of FIG. 1 in accordance with first and second embodiments of the present invention.

To determine $x_m$ and $v_m$, timing recovery circuit 123, pursuant to the first embodiment of the present invention, determines the delay provided by each equalizer to a predetermined nonzero frequency component of that equalizer's input signal lying within the frequency band of interest. Refer now to FIG. 2 which shows the sequence of operations provided by timing recovery circuit 123 when operating in accordance with the first embodiment of the present invention. As shown therein, timing recovery circuit 145 first initializes D(m) and two parameters F(0) and G(0) (all further described below) all to zero at step 201. Next, at step 202, the quantities $Q_A$, $Q_C$, $R_A$, $R_C$, $S_A$ and $S_C$ are determined. At step 204, the delay provided by equalizer A to a predetermined nonzero frequency component of its input signal in the frequency band of interest, designated as $D_A(\omega)$, is calculated. At step 206, the delay provided by equalizer C to a predetermined nonzero frequency component of its input signal in the frequency band of interest, designated as $D_C(\omega)$, is calculated. The present value of the average of $D_A(\omega)$ and $D_C(\omega)$, designated as D(m), is determined at step 208. As indicated at step 211, D(m) is then filtered by passing it through a first stage of linear filtering to generate a filtered signal F(m) in accordance with $$F(m) = F(m-1) + \alpha[D(m) - F(m-1)] \quad (8)$$

In Eq. (8), $\alpha$ is the same $\alpha$ used in Eq. (7). In addition, at step 211, F(m) is passed through a second stage of linear filtering to generate a filtered signal G(m) in accordance with $$G(m) = G(m-1) + \alpha[F(m) - G(m-1)] \quad (9)$$

As shown in step 215, the variables $x_m$ and $v_m$—actually a scaled version thereof $$\frac{v_m}{\alpha}$$

—are then determined from F(m) and G(m) in accordance with $$x_m = 2F(m-1) - G(m-2) \quad (10)$$

$$\frac{v_m}{\alpha} = F(m) - G(m-1) \quad (11)$$

Given the values of $x_m$ and $v_m/\alpha$ from step 215, timing recovery circuit 123 can then update, in accordance with Eqs. (4) and (6), the registers that it uses to hold $V_m$ and $X_m$, as shown at step 217. It is then determined at step 221 whether $X_m$ has overflowed, i.e., exceeded +1. If it has, then at step 222, timing recovery circuit 123 provides a signal to receiver timing generator 105 shown in FIG. 1. In response thereto, generator 105 increments the phase of the master clock signals from master clock source 122 and passes these phase incremented master clock signals as sampling clock signals to A/D converters 103 and 104. At step 222, $X_m$ is also cleared to zero. Alternatively, if it is determined at step 224 that $X_m$ has underflowed, i.e., become more negative than −1, then at step 227, timing recovery circuit 123 provides another signal to receiver timing generator 105. In response thereto, generator 105 decrements the phase of the master clock signals as sampling clock signals coupled to it and passes these phase decremented master clock signals as sampling clock signals to A/D converters 103 and 104. In addition, $X_m$ is cleared to zero at step 227.

At this point, F(m) and G(m)—whose values will be used at steps 211 and 215 in the next symbol interval (where they will appear as F(m−1) and G(m−1), respectively)—must be updated. The reason for this is that having changed $X_m$ (at step 217), we have effectively changed the value of $x_m$. The values of F(m) and G(m) must therefore be adjusted so as to be consistent with the new implicit value of $x_m$ carried forward into the next symbol interval.

Specifically, in order to determine the amount by which F(m) and G(m) should be adjusted, we iteratively substitute in Eq. (8) the expression for F(m−1) derived from Eq. (8) itself, i.e., $$F(m-1) = F(m-2) + \alpha[D(m-1) - F(m-2)] \quad (12),$$

and so forth for a large value of m, and making the assumption that $v_m$ is a constant equal to [D(m)−D(m−1)] for all m—an assumption that, indeed, is justifiable because of the corrections that are in fact made to F(m) and G(m) for each symbol interval—then we arrive at $$F(m) = x_m - \frac{(1-\alpha)v_m}{\alpha}.$$

By assuming that (1−α) is approximately equal to unity, we can write $$F(m) = x_m - \frac{v_m}{\alpha} \quad (13)$$

Following the same approach, it can be shown that $$G(m) = x_m - \frac{2v_m}{\alpha} \quad (14)$$

From Eqs. (13) and (14), then, we see that when $X_m$ and $V_m$ are changed by $\Delta X_m$ and $\Delta V_m$, respectively, then the corresponding changes in F(m) and G(m) are $$[\Delta X_m - \Delta V_m/\alpha]/2^{11} \quad (15)$$

for F(m) and $$[\Delta X_m - 2\Delta V_m/\alpha]/2^{11} \quad (16)$$

for G(m).

Assuming a master clock source 122 in FIG. 1 which provides 4096 clock pulses every T seconds and T/2 type equalizers A and C, therefore, there are 2048 ($2^{11}$) clock pulses every T/2 seconds.

The adjustments set forth in Eqs. (15) and (16) are subtracted from F(m) and G(m) at step 231.

Use of the delay provided by each equalizer in receiver 100 of FIG. 1 to more than one frequency component of that equalizer's input signal in the frequency band of interest is also possible. Indeed, this is done in the second embodiment of the present invention. More specifically, in the second embodiment of the present invention, timing recovery is a function of the delay response and the amplitude response of an equalizer for more than one frequency component of the equalizer's input signal. Again, it is advantageous to select each frequency component in the frequency band of interest.

We have previously defined the delay response of an equalizer, for example equalizer A, to a predetermined non-zero frequency component of equalizer A's input signal $D_A(\omega)$. The transfer function, $G_A(\omega)$, to a predetermined frequency component of equalizer A's input signal can be expressed as $$G_A(\omega) = \sum_k (a_k + jb_k)e^{-j\omega kT} \quad (17)$$

The square of the magnitude of $G_A(\omega)$ or the amplitude response of equalizer A is $|G(\omega)|^2$ where $$|G(\omega)|^2 = \left[\sum_k a_k\cos(k\omega T)\right]^2 + \left[\sum_k a_k\sin(k\omega T)\right]^2 + \quad (18)$$
$$\left[\sum_k b_k\cos(k\omega T)\right]^2 + \left[\sum_k b_k\sin(k\omega T)\right]^2 -$$
$$2\left[\sum_k b_k\cos(k\omega T)\right]\left[\sum_k a_k\sin(\omega kT)\right] +$$
$$2\left[\sum_k a_k\cos\omega kT\right]\left[\sum_k b_k\sin\omega kT\right]$$

The weighted average of the delay response and amplitude response for a plurality of predetermined frequency components $\omega_0, \omega_1 \ldots$ of equalizer A's input signal can be expressed as $W_A(\omega)$ where $$W_A(\omega) = \frac{|G_A(\omega_0)|^2 D_A(\omega_0) + |G_A(\omega_1)|^2 D_A(\omega_1) \ldots}{|G_A(\omega_0)|^2 + |G_A(\omega_1)|^2 \ldots} \quad (19)$$

As the number of frequency components is increased, equation (19) in the limit becomes $$W_A(\omega) = \frac{\int_0^{\omega = \pi/T} |G_A(\omega)|^2 D_A(\omega)d\omega}{\int_0^{\omega = \pi/T} |G_A(\omega)|^2 d\omega} \quad (20)$$

It can be shown that equation (20) can be written as $$W_A(\omega) = \frac{\sum\limits_{k} k(a_k^2 + b_k^2)}{\sum\limits_{k} a_k^2 + b_k^2} \quad (21)$$

Similarly, the weighted average of the delay and amplitude responses for equalizer C for a plurality of frequency components in the equalizer C input signal can, in the limit, be expressed as $$W_C(\omega) = \frac{\sum\limits_{k} k(c_k^2 + d_k^2)}{\sum\limits_{k} (c_k^2 + d_k^2)} \quad (22)$$

Figure 3:
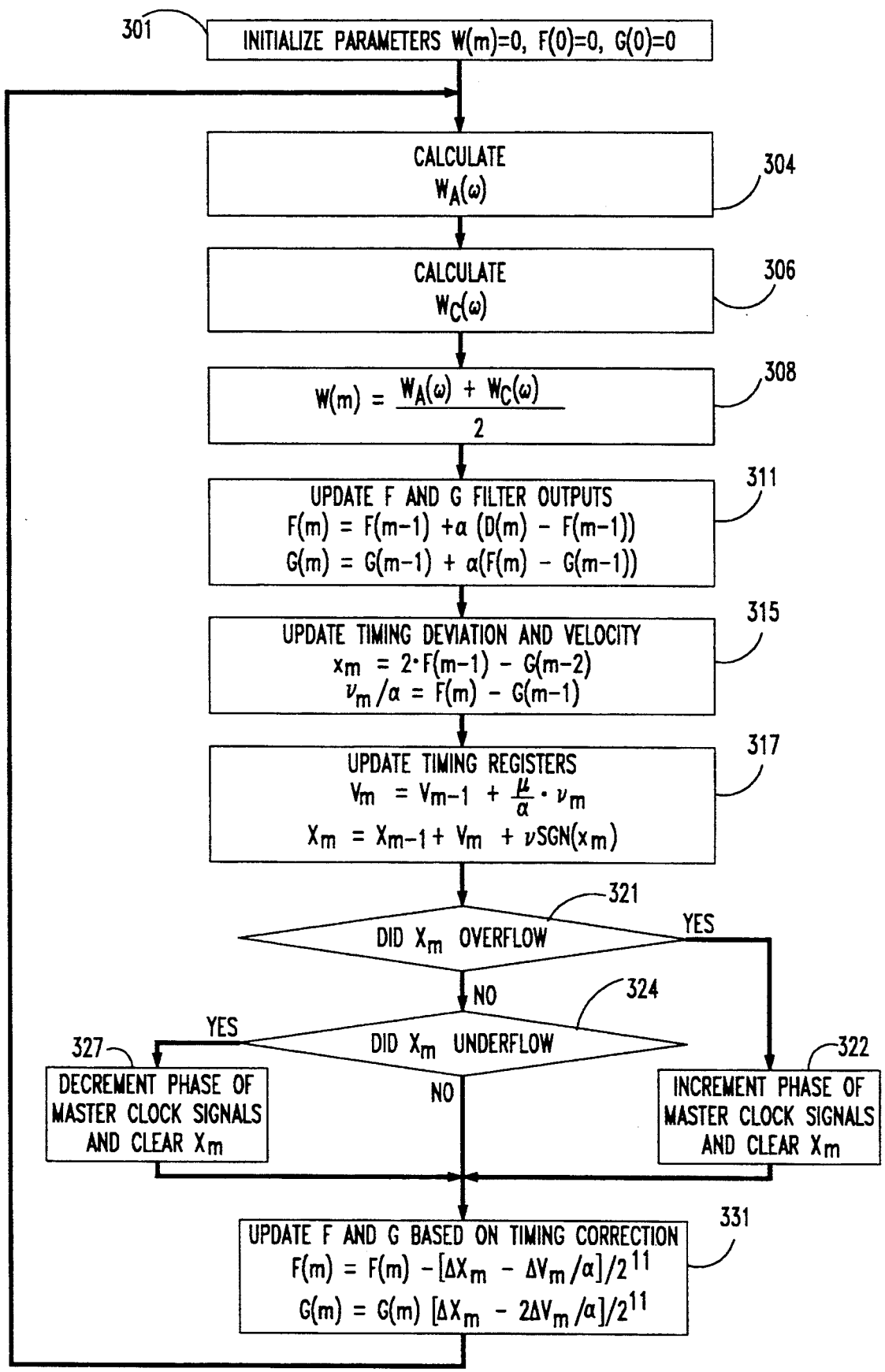

Equations (21) and (22) are utilized in the second embodiment of the present invention. Refer now to FIG. 3 which shows the sequence of operations performed by timing recovery circuit 123 in this embodiment. At step 301, W(m) and two parameters F(0) and G(0) (all further described below) are all initialized to zero. At step 304, the weighted average of the delay and amplitude responses of equalizer A, $W_A(\omega)$ is determined. The corresponding weighted average $W_C(\omega)$ is determined at step 306. These two weighted averages are then combined at step 308 to form W(m). This quantity, which is the arithmetic average of the two weighted averages $W_A(\omega)$ and $W_C(\omega)$, is then utilized in steps 311 through 331 to provide appropriate sampling clock signals from receiving timing generator 105 to A/D converters 103 and 104. Steps 311 through 331 are respectively identical to steps 211 through 231 except that the quantities W(m) and W(m−1) are respectively utilized in the former in lieu of D(m) and D(m−1).

The foregoing merely illustrates the principles of the invention. Thus, for example, although the receiver of FIG. 1 is shown as being comprised of individual hardware elements, the equivalent signal processing may be carried out using one or more programmed processors operating under the control of microcode, firmware, software, etc. And, of course, the various frequencies and other numerical parameters set forth herein are merely illustrative and will differ in varying applications.

It is thus the case that those skilled in the art will be able to devise numerous arrangements which, although not explicitly shown herein, embody the principles of the invention. For example, while the present invention has been disclosed in reference to an illustrative dual duplex system, the present invention is not limited to such a system and is applicable to virtually any digital communication system utilizing one or more baseband or passband equalizers. Or, for example while each of the coefficients in the disclosed embodiments is a complex number, the present invention is also applicable to real-valued coefficients. In addition, while the disclosed embodiments utilize QAM modulation, the present invention can be employed in systems using other modulation schemes and which transmit data at a variety of data rates. Finally, while two equalizers are shown in FIG. 1, one equalizer could be used which would alternately receive signals from channels A and C and then equalize such channels using one of two sets of coefficients which are alternately loaded.

We claim:

1. Apparatus comprising means responsive to a received signal for forming a succession of received signal samples using a sampling clock, said received signal having at least one preselected nonzero frequency component, means for filtering said samples, said filtering means having an amplitude and a delay response, and means for generating said sampling clock as a function of said delay response to said frequency component, said generating means being unresponsive to said amplitude response.

2. The apparatus of claim 1 wherein said filtering means utilize a plurality of coefficients and said delay response is a function of said coefficients.

3. The apparatus of claim 1 wherein said filtering means includes a baseband equalizer.

4. The apparatus of claim 1 wherein said filtering means includes a passband equalizer.

5. The apparatus of claim 1 wherein said samples have substantially all of their energy lying within a frequency band and said preselected nonzero frequency component lies within said frequency band.

6. The apparatus of claim 1 wherein said generating means generates said sampling clock also as a function of the delay provided by said delay response of said filtering means to a zero frequency (dc) signal applied to said filtering means.

7. Apparatus comprising means responsive to a received signal for forming a succession of received signal samples using a sampling clock, means for filtering said samples, said filtering means having an amplitude and a delay response, means for forming a weighted average of said amplitude and delay responses, and means for generating said sampling clock as a function of said weighted average.

8. The apparatus of claim 7 wherein said forming means forms each sample using a received signal sampling interval of duration T and m denotes any one of such intervals, said delay and amplitude responses are each a function of frequency respectively represented by D($\omega$) and $|G(\omega)|^2$ and said weighted average, W(m), is $$W(m) = \frac{\int_{0}^{\omega = \pi/T} |G(\omega)|^2 D(\omega) d\omega}{\int_{0}^{\omega = \pi/T} |G(\omega)|^2 d\omega}.$$

9. A method comprising the steps of forming, in response to a received signal, a succession of received signal samples using a sampling clock, said received signal having at least one nonzero frequency component, filtering said samples, said filtering step having an amplitude and a delay response, and generating said sampling clock as a function of said delay response to said frequency component, said generating step being unaffected by said amplitude response of said filtering step.

10. Apparatus for use in a communications system wherein each of a plurality of communications channels transmits a respective signal, said apparatus comprising means responsive to a signal received from each of said communications channels for forming a plurality of received signal sample sequences using a sampling clock, each such sample sequence being formed in response to the signal received from a different one of said communications channels, each signal received from a communications channel having quadrature-related component signals, means for filtering each of said plurality of received signal sample sequences to form a plurality of filtered received signal sample sequences, each such filtered sequence being associated with a different one of said received signal sample sequences, said filtering means providing a delay response, and means for generating said sampling clock as a function of said delay response evaluated at a preselected nonzero frequency.

11. The apparatus of claim 10 wherein said filtering means utilizes a different plurality of coefficients for each received signal sample sequence.

12. The apparatus of claim 10 wherein said delay response is a function of the coefficients used by said filtering means.

13. The apparatus of claim 10 wherein said filtering means includes at least one baseband equalizer.

14. The apparatus of claim 10 wherein said filtering means includes at least one passband equalizer.

15. The apparatus of claim 10 wherein said samples in each of said plurality of received signal samples sequences have substantially all of their energy lying within a frequency band which encompasses said preselected nonzero frequency.

16. The apparatus of claim 10 wherein said generating means is also responsive to a function of said delay response evaluated at zero frequency (dc).

17. The apparatus of claim 10 wherein said filtering means has an amplitude response for each of said plurality of received signal sample sequences and said generating means generates said sampling clock also as a function of these amplitude responses.

18. The apparatus of claim 17 wherein said generating means forms a weighted average of said delay and amplitude responses and generates said sampling clock as a function of said weighted average.

19. The apparatus of claim 17 wherein said forming means forms each sample using a received signal sampling interval of duration T and m denotes any one of such intervals, and said filtering means provides delay responses $D_A(\omega)$ and $D_C(\omega)$ and amplitude responses $|G_A(\omega)|^2$ and $|G_C(\omega)|^2$ and said generating means generates said sampling clock as a function of a weighted average of $W_A(\omega)$ and $W_C(\omega)$, where $W_A(\omega)=$ $$W_A(\omega) = \frac{\int_o^{\omega = \pi/T} |G_A(\omega)|^2 D_A(\omega) d\omega}{\int_o^{\omega = \pi/T} |G_A(\omega)|^2 d\omega}$$

and where $W_C(\omega)=$ $$W_C(\omega) = \frac{\int_o^{\omega = \pi/T} |G_C(\omega)|^2 D_C(\omega) d\omega}{\int_o^{\omega = \pi/T} |G_C(\omega)|^2 d\omega}.$$

20. The apparatus of claim 19 wherein said generating means generates said sampling clock as a function of an arithmetic average of $W_A(\omega)$ and $W_C(\omega)$.

21. A method for use in a communications system wherein each of a plurality of communications channels transmits a respective signal, said method comprising the steps of forming a plurality of sample sequences using a sampling clock, each such sample sequences being formed in response to a signal received from a different one of said communications channels, said signal received from each communications channel having quadrature-related component signals, filtering said plurality of received signal sample sequences to form a plurality of filtered sample sequences, each filtered sample sequence being associated with a different one of said received signal sample sequences, said filtering step having a delay response, and generating said sampling clock as a function of said delay response evaluated at at least one frequency.

22. A method comprising the steps of forming a succession of samples with a sampling clock in response to a received signal, filtering said samples, said filtering step having an amplitude response and a delay response, forming a weighted average of said amplitude and said delay responses; and generating said sampling clock as a function of said weighted average.

23. Apparatus comprising means responsive to a received signal for forming a succession of samples using a sampling clock, said received signal being representative of data, means for filtering said samples to provide filtered samples, said filtering means having a delay response, means for quantizing said filtered samples to recover the data therein, and means for generating said sampling clock as a function of said delay response evaluated at at least one nonzero frequency, the delay response used to generate said sampling clock and that which is experienced by said filtered samples after quantizing are the same.

24. A method comprising the steps of forming a succession of samples of a received signal using a sampling clock, said received signal being representative of data, filtering said samples to provide filtered samples, said filtering step having a delay response, quantizing said filtered samples to recover the data therein, and generating said sampling clock as a function of said delay response evaluated at some preselected nonzero frequency, wherein the delay response which is used to adjust said sampling clock and that which is experienced by said filtered samples after quantizing are the same.

* * * * *